US011410831B2

(12) United States Patent
Nicolas

(10) Patent No.: US 11,410,831 B2
(45) Date of Patent: Aug. 9, 2022

(54) BEAM POSITION MONITOR FOR CHARGED PARTICLES PASSING THROUGH A CHAMBER

(71) Applicant: COMMISSARIAT A L'ENERGIE ATOMIQUE ET AUX ENERGIES ALTERNATIVES, Paris (FR)

(72) Inventor: Rémi Nicolas, Is sur Tille (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/122,523

(22) Filed: Dec. 15, 2020

(65) Prior Publication Data

US 2021/0183613 A1  Jun. 17, 2021

(30) Foreign Application Priority Data

Dec. 17, 2019 (FR) ..................................... 19 14595

(51) Int. Cl.
| | | |
|---|---|---|
| *H01J 37/244* | (2006.01) | |
| *H01J 37/26* | (2006.01) | |
| *H01J 37/30* | (2006.01) | |
| *H05H 7/00* | (2006.01) | |

(52) U.S. Cl.
CPC .......... *H01J 37/244* (2013.01); *H01J 37/261* (2013.01); *H01J 37/3002* (2013.01); *H05H 2007/008* (2013.01)

(58) Field of Classification Search
CPC ... H05H 7/00; H05H 2007/008; H01J 37/244; H01J 27/261; H01J 37/3002

USPC ......................................................... 250/397
See application file for complete search history.

(56) References Cited

U.S. PATENT DOCUMENTS

| | | | | | |
|---|---|---|---|---|---|
| 3,496,463 | A | * | 2/1970 | Johnston .................. | H01J 29/54 250/336.1 |
| 4,633,172 | A | * | 12/1986 | Ekdahl, Jr. .......... | G01R 19/0061 250/397 |
| 5,057,766 | A | * | 10/1991 | Nakata ..................... | H05H 7/00 324/71.3 |
| 6,774,383 | B2 | * | 8/2004 | Norimine ............. | A61N 5/1048 250/492.3 |

(Continued)

OTHER PUBLICATIONS

French Preliminary Search Report dated Sep. 8, 2020 in French Application 19 14595 filed Dec. 17, 2019 (with English Translation of Categories of Cited Documents and Written Opinion), 9 pages.

(Continued)

*Primary Examiner* — Wyatt A Stoffa
(74) *Attorney, Agent, or Firm* — Oblon, McClelland, Maier & Neustadt, L.L.P.

(57) ABSTRACT

A beam position monitor is provided, for measuring a position of a beam of charged particles passing through a chamber, the beam position monitor including a first magnetic field sensor and a second magnetic field sensor configured to be installed in the chamber on either side of the beam of charged particles, each magnetic field sensor including a conductive loop, the conductive loop of the first magnetic field sensor and the conductive loop of the second magnetic field sensor being configured to have inductances different from one another. A measurement system and a particle accelerator are also provided.

17 Claims, 3 Drawing Sheets

(56) References Cited

U.S. PATENT DOCUMENTS 9,535,100 B2 * 1/2017 McAninch ......... B23K 15/0026
10,306,745 B2 * 5/2019 Aoki ................... H05H 13/005

OTHER PUBLICATIONS

Shafiee, M. et al., "Design and Construction of Inductive BPM," Proceedings of IPAC2012, XP002800130, 2012, 3 pages.

Gasior, M. "A Current Mode Inductive Pick-Up for Beam Position and Current Measurement," European Organization for Nuclear Research, Proceedings of DIPAC 2005, Jul. 2005, XP002800131, 4 pages.

Verzilov, V. A. et al., "A New Beam Position Monitor for the Triumf Cyclotron Beamlines," Cyclotrons and Their Applications 2007, Eighteenth International Conference, Oct. 1, 2007, XP002800132, 3 pages.

Barry, W., "A general analysis of thin wire pickups for high frequency beam position monitors," Nuclear Instruments & Methods in Physics Research, Section A, vol. A301, No. 3, Mar. 15, 1991, XP000227144, 10 pages.

* cited by examiner

BEAM POSITION MONITOR FOR CHARGED PARTICLES PASSING THROUGH A CHAMBER

TECHNICAL FIELD

The invention lies in the field of non-intrusive detection of the position of a beam of electrically charged particles passing through a chamber. It relates to a beam position monitor comprising at least two magnetic field sensors disposed in the chamber on either side of the beam of particles. The invention also relates to a measurement system comprising such a monitor and a processing chain arranged to determine the position of the beam on the basis of the signals provided by the magnetic field sensors. Finally, the invention relates to a particle accelerator comprising a chamber arranged to guide a beam of charged particles, and a beam position monitor or a measurement system.

The invention applies in particular to the detection of the position of a beam of particles in a particle accelerator but can also be used for the detection of the position of any beam of electrically charged particles passing through a chamber, regardless of the dimensions of the chamber and regardless of the intensity of the beam of particles. In particular, the invention can be used in an electron microscope, with ionic motors or with medical machines for radiation therapy or proton therapy.

PRIOR ART

In a particle accelerator, it is necessary to precisely control the position of the beam of particles passing through the tube, in particular to be able to precisely guide the beam of particles to its point of impact. For this purpose, the tube comprises a multitude of beam position monitors distributed over its length. Each beam position monitor generally includes four magnetic field sensors, routinely called B-dot sensors, disposed at the inner envelope of the tube. Each magnetic field sensor comprises a conductive loop at the terminals of which a voltage (electromotive force) is generated by a variation in the magnetic field resulting from the passage of the beam of particles. Two magnetic field sensors are installed on a vertical axis, on either side of the longitudinal axis of the tube, in such a way as to provide a piece of information on position along this vertical axis by comparison of the voltages generated in their loops, and two magnetic field sensors are installed on a horizontal axis, on either side of the axis of the tube, in such a way as to provide a piece of information on position along this horizontal axis by comparison of the voltages generated in their loops. In practice, the signals coming from the magnetic field sensors of each pair are injected into an adder. Because of the symmetrical position of the magnetic field sensors, the signal coming from the adder is representative of the difference in amplitude of voltage between the two loops. An output of the adder is then connected to an integrator associated with a digitization means. In order to avoid the integration or the digitization of a quasi-null amplitude signal, the signals coming from the magnetic field sensors are attenuated by different attenuation factors before their integration and their digitization. For example, one of the attenuators can have an attenuation factor of 3 dB while the other attenuator can have an attenuation factor of 6 dB. The introduction of the attenuators into the measurement chain has, however, the disadvantage of reducing the amplitude of the measurement signals, leading to a degradation of the signal-to-noise ratio and thus of the precision of the positioning of the beam of particles.

Given the above, the goal of the invention is to provide a beam position monitor having an increased precision. The goal of the invention is also to provide a beam position monitor having reduced design, manufacturing and maintenance costs.

SUMMARY OF THE INVENTION

For this purpose, the invention is based on the use of pairs of magnetic field sensors, the conductive loops of which have inductances different from one another. The dissymmetry in amplitude of the signals is thus introduced by the sensors themselves, making the presence of the attenuators useless. The elimination of the attenuators allows a maximum signal amplitude to be preserved before processing and the number of connectors in the processing chain to be reduced.

More precisely, the object of the invention is a beam position monitor for measuring a position of a beam of charged particles passing through a chamber, the beam position monitor comprising a first magnetic field sensor and a second magnetic field sensor arranged to be installed in the chamber on either side of the beam of particles, each magnetic field sensor comprising a conductive loop. According to the invention, the conductive loop of the first magnetic field sensor and the conductive loop of the second magnetic field sensor are arranged to have inductances different from one another.

In other words, the conductive loop of the first magnetic field sensor and the conductive loop of the second magnetic field sensor are arranged for a ratio between their inductances to be a positive real number different than zero and one.

The magnetic field sensors are preferably installed in the chamber so that their conductive loops are disposed symmetrically from one another with respect to an expected position of the axis of propagation of the beam of particles. Typically, the expected position of the axis of propagation of the beam of particles corresponds to the position of an axis of symmetry of the chamber. For a particle accelerator, this axis corresponds to the longitudinal axis of its tube.

The conductive loop of the first magnetic field sensor and the conductive loop of the second magnetic field sensor can have numbers of turns different from one another and/or shapes different from one another and/or dimensions different from one another. The turns of each conductive loop are preferably coaxial.

According to a first specific embodiment, the conductive loop of the first magnetic field sensor and the conductive loop of the second magnetic field sensor each have a single turn, having shapes different from one another and/or dimensions different from one another. More generally, the conductive loop of the first magnetic field sensor and the conductive loop of the second magnetic field sensor can each have the same number of turns, having shapes different from each other and/or having dimensions different from each another. In each conductive loop, the shape and the dimensions of its various turns are preferably identical.

According to a second specific embodiment, the conductive loop of the first magnetic field sensor and the conductive loop of the second magnetic field sensor have turns having the same shape and the same dimensions in different numbers. In other words, the conductive loop of the first magnetic field sensor has a number of turns different than the number of turns of the conductive loop of the second magnetic field sensor, the turns of the conductive loop of the first magnetic field sensor and the turns of the conductive loop of the second magnetic field sensor having an identical shape and identical dimensions. A ratio between the inductances of the first and second magnetic field sensors is thus an integer greater than or equal to two.

The first magnetic field sensor and the second magnetic field sensor form a first pair of position sensors, arranged to provide a piece of information on position of the beam of particles along a first axis passing through these magnetic field sensors. This first axis is for example a vertical axis, perpendicular to the axis of symmetry of the chamber.

The beam position monitor can further comprise a third magnetic field sensor and a fourth magnetic field sensor arranged to be installed in the chamber on either side of the beam of particles, each magnetic field sensor comprising a conductive loop. The conductive loop of the third magnetic field sensor and the conductive loop of the fourth magnetic field sensor are preferably arranged to have inductances different from one another.

The third magnetic field sensor and the fourth magnetic field sensor thus form a second pair of position sensors, arranged to provide a piece of information on position of the beam of particles along a second axis passing through these magnetic field sensors. This second axis is for example a horizontal axis, perpendicular to the axis of symmetry of the chamber.

Preferably, the first magnetic field sensor, the second magnetic field sensor, the third magnetic field sensor and the fourth magnetic field sensor are arranged in the same plane perpendicular to the beam of particles. In other words, the second axis is perpendicular to the first axis. The position sensors are thus distributed angularly around the axis of symmetry of the chamber with an angle of 90 degrees. Such an arrangement allows the position of the beam of particles to be determined in a plane perpendicular to the axis of symmetry of the chamber. This plane is called "measurement plane".

The beam position monitor can further comprise a fifth magnetic field sensor and a sixth magnetic field sensor arranged to be installed in the chamber on either side of the beam of particles, each magnetic field sensor comprising a conductive loop. The conductive loop of the fifth magnetic field sensor and the conductive loop of the sixth magnetic field sensor are for example arranged to have the same inductance.

According to a specific embodiment, the beam position monitor further comprises a chassis arranged to be fastened to the chamber and/or form a section of the chamber. The chassis comprises:
  a central opening arranged to let the beam of particles pass, and
  a receiving cavity for each magnetic field sensor, each receiving cavity opening into the central opening and being arranged to receive one of the magnetic field sensors.

The object of the invention is also a measurement system comprising a beam position monitor as described above and a first adder, the first adder being arranged to deliver a first difference signal representative of a difference in amplitude between a signal delivered by the first magnetic field sensor and a signal delivered by the second magnetic field sensor.

The measurement system can further comprise a first integrator arranged to receive the first difference signal and deliver a first integrated signal corresponding to an integration over time of the first difference signal.

When the position monitor comprises third and fourth magnetic field sensors, the measurement system can also include a second adder, the second adder being arranged to deliver a second difference signal representative of a difference in amplitude between a signal delivered by the third magnetic field sensor and a signal delivered by the fourth magnetic field sensor.

The measurement system can further comprise a second integrator arranged to receive the second difference signal and deliver a second integrated signal corresponding to an integration over time of the second difference signal.

According to a specific embodiment, each adder is connected directly to the magnetic field sensors. A direct connection is understood as a connection arranged to connect two elements without modifying the properties of the signal transported. A direct connection is typically established by a coaxial cable. In particular, the connection between each adder and the magnetic field sensors can be devoid of an attenuator.

The adders can be analog components. The signals added are thus determined on the basis of analog measurement signals, thus avoiding a loss of information.

Likewise, the integrators can be analog components. The signals integrated can thus be determined on the basis of signals coming from an analog summation, thus avoiding a loss of information by digitization.

The measurement system can further comprise a digitizer arranged to receive each integrated signal in analog form and deliver a corresponding digitized integrated signal.

Finally, the object of the invention is a particle accelerator comprising a chamber arranged to guide a beam of charged particles, and the beam position monitor or the measurement system as described above.

BRIEF DESCRIPTION OF THE DRAWINGS

Other features, details and advantages of the invention will be clear upon reading the following description, given only as an example and made in reference to the appended drawings for which.

DETAILED DESCRIPTION

Figure 1:
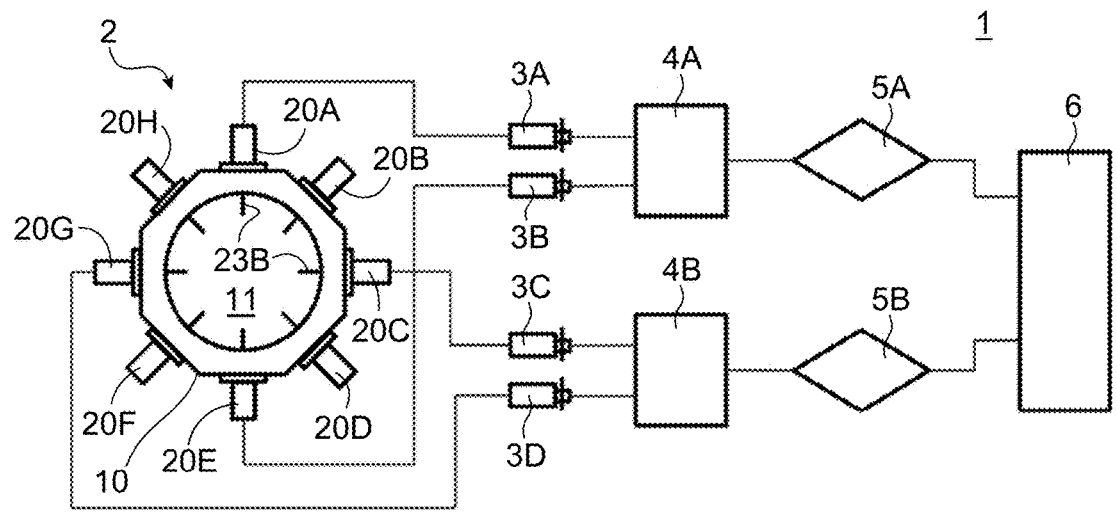
FIG. 1 schematically shows an example of a measurement system according to the prior art for measuring a position of a beam of electrons in a tube of a particle accelerator.

FIG. 1 schematically shows an example of a measurement system according to the prior art for measuring a position of a beam of electrons in a tube of a particle accelerator. The tube typically has a central opening extending along a longitudinal axis or along an arc of a circle. The particle accelerator is arranged for the beam of electrons to propagate on this longitudinal axis or on this arc of a circle. The measurement system 1 comprises a beam position monitor 2, four attenuators 3A, 3B, 3C, 3D, two adders 4A, 4B, two integrators 5A, 5B and a digitizer 6. The beam position monitor 2 comprises a chassis 10 and eight magnetic field sensors 20A, 20B, 20C, 20D, 20E, 20F, 20G, 20H, globally designated by the reference 20. The chassis 10 has a generally cylindrical shape and is arranged to be fastened at least at one of its longitudinal ends to a section of the tube of the particle accelerator. The chassis 10 includes a central opening 11 and eight receiving cavities, not shown, each opening into the central opening 11 and being arranged to receive one of the magnetic field sensors 20. The chassis 10 and its central opening 11 are arranged so that the beam position monitor 2 forms a section of the tube of the particle accelerator. In particular, the diameter of the central opening 11 is substantially equal to the inner diameter of the section of tube to which the chassis 10 is fastened.

Figure 2A:
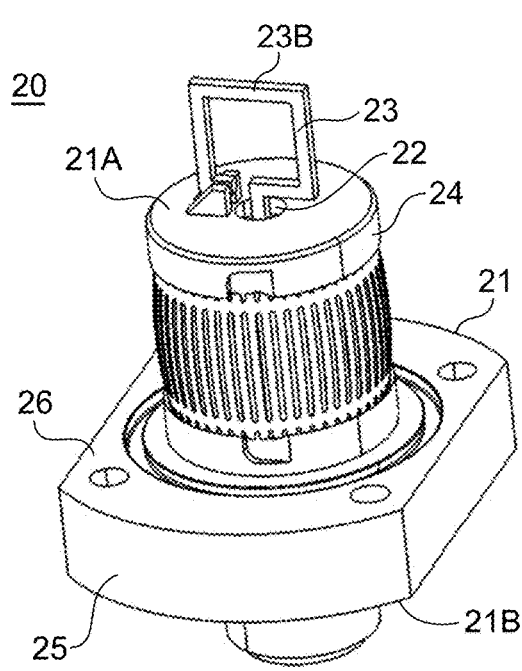
FIG. 2A shows, in a perspective view, a magnetic field sensor of the measurement system of FIG. 1.
Figure 2B:
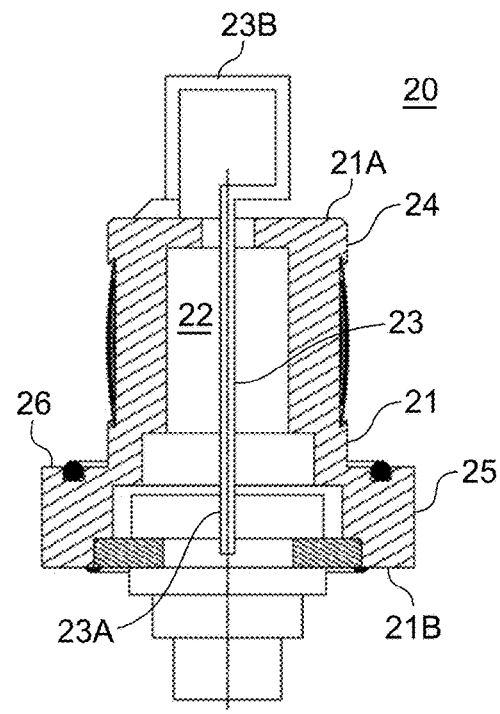
FIG. 2B shows the magnetic field sensor of FIG. 2A in a longitudinal cross-sectional view.

FIGS. 2A and 2B show in detail, in a perspective view and in a longitudinal cross-sectional view, respectively, the magnetic field sensors 20. The magnetic field sensors 20 are routinely called "B-dot sensor". Each sensor includes a body 21, a through-hole 22 and a conductive element 23. The body 21 comprises a tubular part 24 and a base 25. The tubular part 24 is arranged to be able to be inserted into a receiving cavity of the chassis 10. The base 25 has a diameter greater than the diameter of the tubular part 24, in such a way as to form a shoulder 26 arranged to bear on an outer surface of the chassis 10. The through-hole 22 extends in the tubular part 24 and in the base 25 of the body 21. It is arranged to allow the conductive element 23 to pass through the body 21 between a first end 21A, intended to open into the central opening 11 of the chassis 10, and a second end 21B, accessible from outside the chassis 10 when the magnetic field sensor 20 is received in a receiving cavity of the chassis 10. The conductive element 23 comprises a rectilinear part 23A extending between the ends 21A and 21B of the body 21, and a loop 23B formed on the side of the end 21A. The loop 23B is formed by a simple turn and is connected by its free end to the body 21. The magnetic field sensor 20 thus allows a voltage to be generated between the conductive element 23 and the body 21 during a variation in the magnetic field caused by the passage of a beam of electrons.

Reference is once again made to FIG. 1. The beam position monitor 2 and the magnetic field sensors 20 are arranged so that the loops 23B of the magnetic field sensors 20 are located in the same measurement plane and distributed angularly around the center of the central opening 11 of the chassis 10. In particular, in the case of a beam position monitor 2 comprising eight magnetic field sensors, the loops 23B are distributed with an angle of 45 degrees. In order to be able to measure a variation in the magnetic field caused by the passage of a beam of electrons in the measurement plane, each loop 23B is formed in a plane passing through the axis of propagation of the beam of electrons.

The magnetic field sensors 20 are used in pairs, each pair comprising a sensor forming a "positive" path and a sensor forming a "negative" path. The magnetic field sensors 20A and 20E are disposed on a vertical axis and form a pair of vertical position sensors; the magnetic field sensors 20C and 20G are disposed on a horizontal axis and form a pair of horizontal position sensors. The magnetic field sensors 20B and 20F are disposed on an axis inclined by 45 degrees with respect to the vertical axis and form a first pair of intensity sensors; the magnetic field sensors 20D and 20H are disposed on an axis inclined by −45 degrees with respect to the vertical axis and form a second pair of intensity sensors. In each pair, the magnetic field sensors 20 are disposed symmetrically from one another with respect to the center of the central opening 11 of the chassis 10 that is to say symmetrically with respect to the axis of propagation of the beam of electrons. More precisely, in each pair, the center of the conductive loop of one of the magnetic field sensors 20 is disposed symmetrically from the center of the conductive loop of the other magnetic field sensor 20.

The magnetic field sensor 20A is connected to a first input of the adder 4A via the attenuator 3A and the magnetic field sensor 20E is connected to a second input of the adder 4A via the attenuator 3B. Analogously, the magnetic field sensor 20C is connected to a first input of the adder 4B via the attenuator 3C and the magnetic field sensor 20G is connected to a second input of the adder 4B via the attenuator 3D. The attenuators 3A and 3B and respectively 3C and 3D have attenuation factors distinct from one another. For example, the attenuators 3A and 3C have an attenuator factor of 3 dB while the attenuators 3B and 3D have an attenuation factor of 6 dB. The adders 4A and 4B are passive analog components. The adder 4A adds the signals coming from the attenuators 3A and 3B. More precisely, it delivers a vertical difference signal, the amplitude of which corresponds to the difference between the amplitude of the voltage at the terminals of the magnetic field sensor 20A, after attenuation, and the amplitude of the voltage at the terminals of the magnetic field sensor 20E, after attenuation. The adder 4B adds the signals coming from the attenuators 3C and 3D. More precisely, it delivers a horizontal difference signal, the amplitude of which corresponds to the difference between the amplitude of the voltage at the terminals of the magnetic field sensor 20C, after attenuation, and the amplitude of the voltage at the terminals of the magnetic field sensor 20G, after attenuation. An output of the adder 4A is connected to an input of the integrator 5A and an output of the adder 4B is connected to an input of the integrator 5B. The integrators 5A and 5B are passive analog components. The integrator 5A integrates in the time domain the vertical difference signal to give a vertical integrated signal and the integrator 5B integrates in the time domain the horizontal difference signal to give a horizontal integrated signal. An output of the integrator 5A and an output of the integrator 5B are individually connected to inputs of the digitizer 6 arranged to digitize the integrated signals. The digitized integrated signals can then be subject to a processing of the signal in order to determine a position of the beam of electrons in the measurement plane.

The application of attenuation factors differentiated between the positive and negative paths allows a difference signal to be integrated, the amplitude of which is far from the null value, including when the beam of electrons is perfectly centered in the tube. The digitization of the integrated signal and the extraction of time information are thereby facilitated.

Moreover, the magnetic field sensors 20B and 20F can also be connected to the inputs of a third adder, not shown, in order to generate a first intensity signal, the amplitude of which corresponds to the sum of the amplitude of the voltage at the terminals of the magnetic field sensor 20B and the amplitude of the voltage at the terminals of the magnetic field sensor 20F. Analogously, the magnetic field sensors 20D and 20H can be connected to the inputs of a fourth adder, not shown, in order to generate a second intensity signal, the amplitude of which corresponds to the sum of the amplitude of the voltage at the terminals of the magnetic field sensor 20D and the amplitude of the voltage at the terminals of the magnetic field sensor 20H. The use of attenuators is not necessary for these pairs of intensity sensors insofar as the adders are arranged to add the amplitudes of the signals and not to subtract one from the other. An output of the third adder can be connected to an input of a third integrator arranged to deliver a first integrated intensity signal corresponding to the integration over time of the first intensity signal. Likewise, an output of the fourth adder can be connected to an input of a fourth integrator arranged to deliver a second integrated intensity signal corresponding to the integration over time of the second intensity signal. The integrated intensity signals can be digitized and averaged in order to determine an intensity of the beam of electrons. This function is a simple sum of the signals coming from the sensors 20B, 20D, 20F and 20H.

The intensity of the magnetic field measured by the magnetic field sensors 20A, 20C, 20E, 20G forming the pair of vertical position sensors and the pair of horizontal position sensors is proportional not only to the position of the barycenter of the charges carried by the beam of electrons, but also to the intensity of this beam of electrons. Consequently, the complete determination of the position of the beam of electrons requires on the one hand a use of the vertical integrated signal and of the horizontal integrated signal and, on the other hand, a use of the integrated intensity signals.

One disadvantage of the measurement system 1 described above in reference to FIGS. 1 and 2 is that the signals coming from the magnetic field sensors 20A, 20C, 20E, 20G, the amplitude of which is potentially low, are weakened. Moreover, the introduction of components, even passive, generates disturbances for the high-frequency signals. This results in a degradation of the precision of measurement.

The invention overcomes these disadvantages by introducing a differentiation of the amplitude of the signals coming from a pair of magnetic field sensors by different inductances of their loops. In other words, in each pair of position sensors, the magnetic field sensors include loops having inductances different from one another.

Figure 3A:
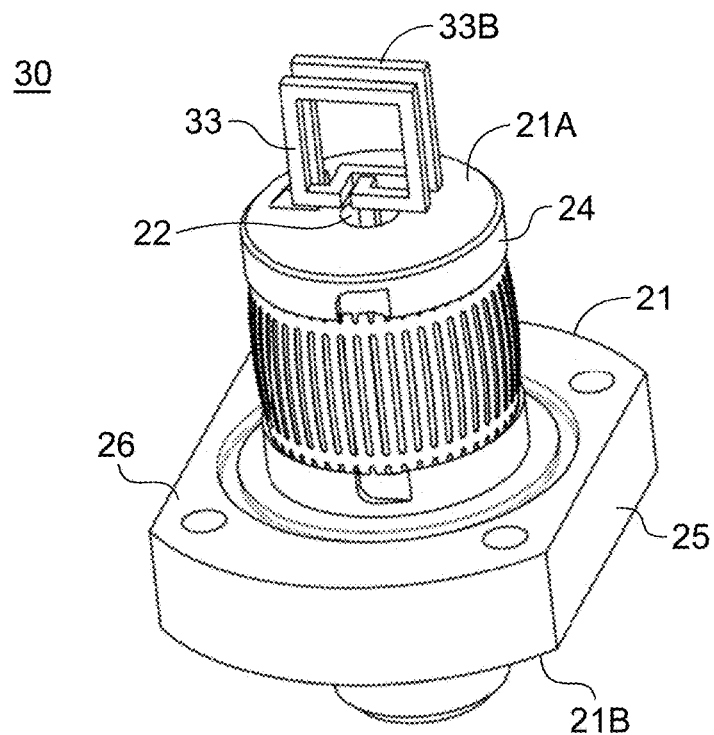
FIG. 3A shows, in a perspective view, an example of a magnetic field sensor for a measurement system according to the invention.
Figure 3B:
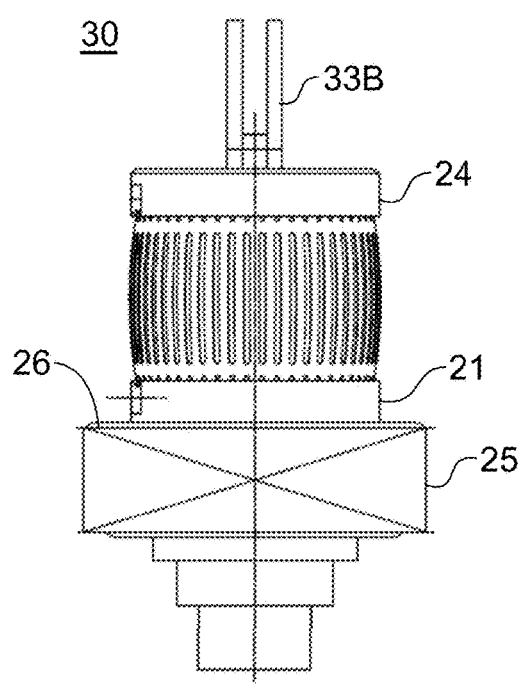
FIG. 3B shows, in a side view, the magnetic field sensor of FIG. 3A.
Figure 3C:
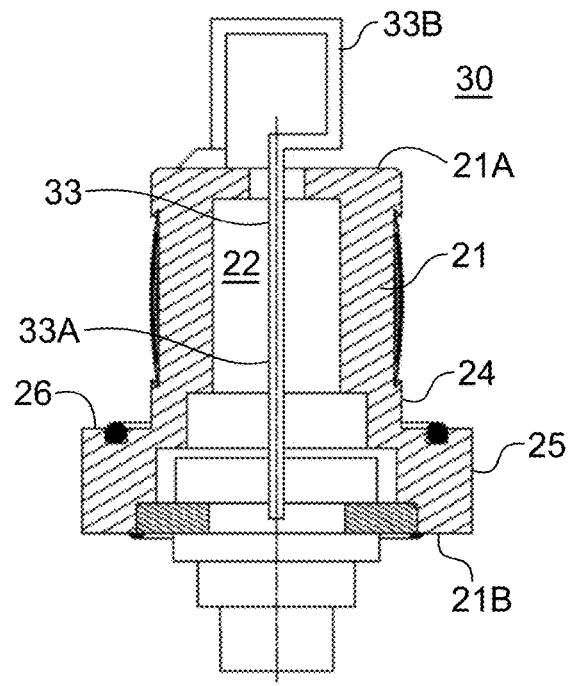
FIG. 3C shows, in a longitudinal cross-sectional view, the magnetic field sensor of FIGS. 3A and 3B.

FIGS. 3A, 3B and 3C show, in a perspective view, in a side view and in a longitudinal cross-sectional view, respectively, an example of a magnetic field sensor 30 having a different inductance than that of the magnetic field sensor 20 of FIG. 2. In a manner identical to the magnetic field sensor 20, the magnetic field sensor 30 includes a body 21 and a through-hole 22. The body 21 comprises a tubular part 24, arranged to be able to be inserted into a receiving cavity of the chassis 10 of the beam position monitor 2, and a base 25 forming a shoulder 26 arranged to bear on the outer surface of the chassis 10. The through-hole 22 extends between the first end 21A and the second end 21B of the body 21. The magnetic field sensor 30 further includes a conductive element 33 comprising a rectilinear part 33A extending between the ends 21A and 21B of the body 21, and a loop 33B formed on the side of the end 21A. The loop 33B is connected by its free end to the body 21. The magnetic field sensor 30 differs from the magnetic field sensor 20 of FIG. 2 in that the loop 33B includes a double turn. The inductance of the loop 33B is thus double that of the loop 23B.

Figure 4:
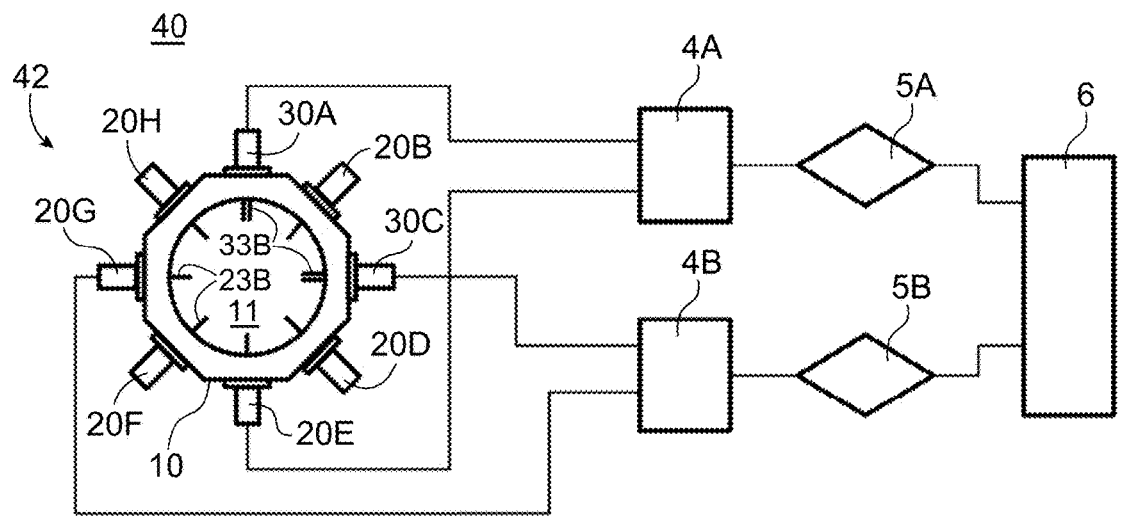
FIG. 4 schematically shows an example of a measurement system according to the invention.

FIG. 4 schematically shows an example of a measurement system according to the invention. The measurement system 40 comprises a beam position monitor 42, two adders 4A, 4B, two integrators 5A, 5B and a digitizer 6. The adders 4A, 4B, the integrators 5A, 5B and the digitizer 6 are identical to the elements of FIG. 1 carrying the same references. The beam position monitor 42 comprises a chassis 10 identical to the chassis of the beam position monitor 2, two magnetic field sensors 30A and 30C, and six magnetic field sensors 20B, 20D, 20E, 20F, 20G and 20H. The magnetic field sensors 30A and 30C have the structure of the magnetic field sensor 30 of FIGS. 3A, 3B and 3C, and are globally designated by the reference 30. The magnetic field sensors 20B, 20D, 20E, 20F, 20G and 20H have the structure of the magnetic field sensor 20 of FIG. 2 and are globally designated by the reference 20. The magnetic field sensors 20, 30 of the beam position monitor 42 are installed on the chassis 10 in an identical manner to the magnetic field sensors 20 of the beam position monitor 2, except for the replacement of the magnetic field sensors 20A and 20C by the magnetic field sensors 30A and 30C, respectively. Thus, the magnetic field sensors 30A and 20E are disposed on the vertical axis and form a pair of vertical position sensors. The sensors 30C and 20G are disposed on the horizontal axis and form a pair of horizontal position sensors. In each pair of position sensors, the magnetic field sensor 30A, 30C of the positive path includes a loop formed from two turns while the magnetic field sensor 20E and 20G of the negative path includes a loop formed from a single turn. The inductances of the magnetic field sensors of each pair are thus different, which leads to the generation of voltages having different amplitudes on the positive and negative paths for a centered beam of electrons. The presence of attenuators can thus be avoided.

The adder 4A is connected by its first input to the magnetic field sensor 30A and by its second input to the magnetic field sensor 20E. It adds the voltages delivered by these magnetic field sensors to deliver a vertical difference signal, the amplitude of which corresponds to the difference between the amplitude of the voltage at the terminals of the magnetic field sensor 30A and the amplitude of the voltage at the terminals of the magnetic field sensor 20E. Analogously, the adder 4B is connected by its first input to the magnetic field sensor 30C and by its second input to the magnetic field sensor 20G. It adds the voltages delivered by these magnetic field sensors to deliver a horizontal difference signal, the amplitude of which corresponds to the difference between the amplitude of the voltage at the terminals of the magnetic field sensor 30C and the amplitude of the voltage at the terminals of the magnetic field sensor 20G. An output of the adder 4A is connected to an input of the integrator 5A and an output of the adder 4B is connected to an input of the integrator 5B. The integrator 5A integrates in the time domain the vertical difference signal to give a vertical integrated signal and the integrator 5B integrates in the time domain the horizontal difference signal to give a horizontal integrated signal. An output of the integrator 5A and an output of the integrator 5B are individually connected to inputs of the digitizer 6 arranged to digitize the integrated signals. The digitized integrated signals can then be subject to a processing of the signal in order to determine a position of the beam of electrons in the measurement plane. The other magnetic field sensors 20B, 20D, 20F and 20H can be connected in an identical manner to the measurement system 1 in such a way as to determine an intensity of the beam of electrons.

Figure 5:
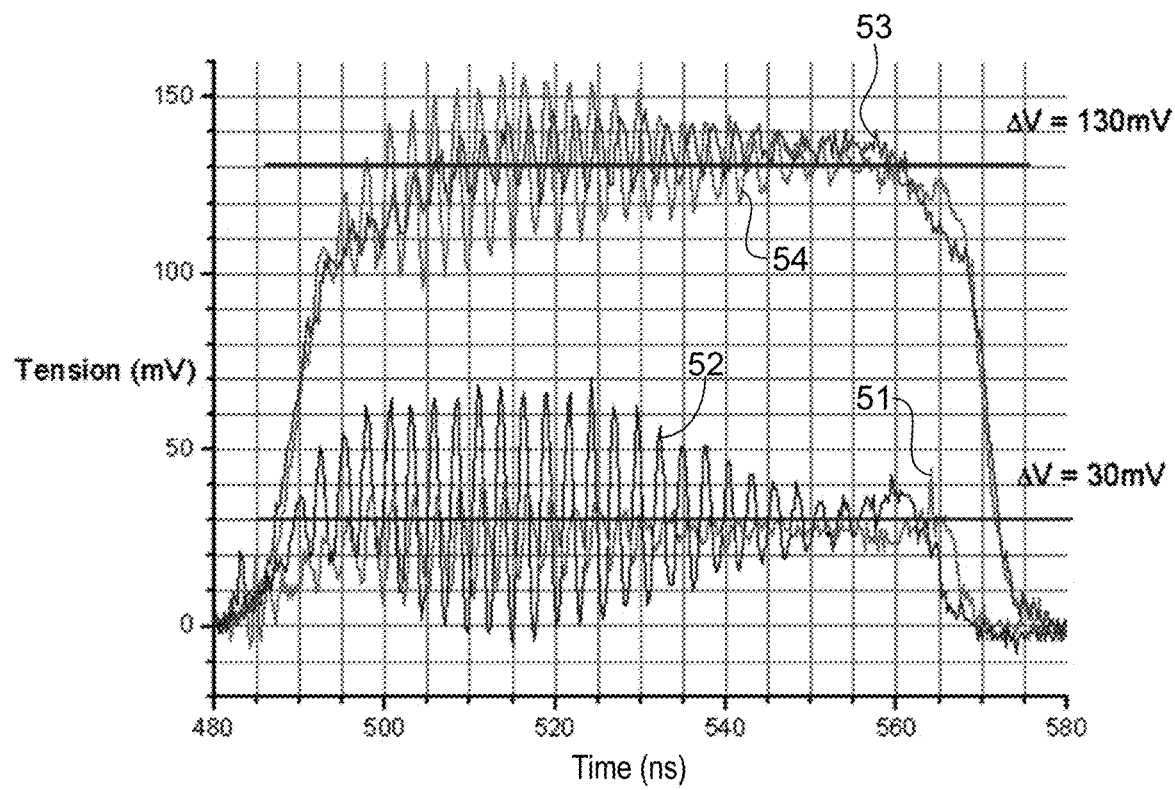
FIG. 5 shows, on a graph, examples of integrated signals obtained with the measurement system of FIG. 1 and with the measurement system of FIG. 4.

FIG. 5 shows, on a graph, examples of integrated signals obtained with the measurement system 1 of FIG. 1 and with the measurement system 40 of FIG. 4 during the passage of a beam of electrons. On this graph, the axis of the abscissae represents the time, in nanoseconds, and the axis of the ordinates represents the amplitude of the voltage of each integrated signal, in millivolts. A first curve 51 represents the vertical integrated signal at the output of the integrator 5A of the measurement system 1; a second curve 52 represents the horizontal integrated signal at the output of the integrator 5B of the measurement system 1; a third curve 53 represents the vertical integrated signal at the output of the integrator 5A of the measurement system 40; and a fourth curve 54 represents the horizontal integrated signal at the output of the integrator 5B of the measurement system 40. Before the passage of a beam of electrons, the integrated signals have a null amplitude. With the passage of the beam of electrons in the measurement plane, the amplitude of the integrated signals starts by increasing as the beam approaches, then the amplitude oscillates around an average value for the duration of the passage of the beam, and decreases to a null value as the beam moves away. It should be noted that during the passage of the beam of electrons, the average amplitude of the integrated signals of the measurement system 1 is substantially equal to 30 mV, while the average amplitude of the integrated signals of the measurement system 40 is substantially equal to 130 mV. The average amplitude of the integrated signals of the measurement system 40 is thus approximately 4 times greater than that of the integrated signals of the measurement system 1. This ratio is explained on the one hand by the absence of attenuators and, on the other hand, by the presence of the loops with a double turn. The signal-to-noise ratio of the integrated signals of the measurement system 40 is clearly greater than that of the integrated signals of the measurement system 1. Consequently, the position of the beam of electrons in the measurement plane can be determined with a much better precision. In the case of a particle accelerator, the position of the beam of electrons can thus be corrected more precisely.

In the present description, the magnetic field sensors of a pair of position sensors have a number of turns equal to one or two. The difference in inductance between two magnetic field sensors can also be created by any pair of different integers, for example 1 and 3, 1 and 4, 2 and 3 or 2 and 4. The difference in inductance can moreover be created by varying other parameters of the loops, such as their shape and their size.

The invention claimed is:

1. A beam position monitor for measuring a position of a beam of charged particles passing through a chamber, the beam position monitor comprising:
    a first magnetic field sensor and a second magnetic field sensor configured to be installed in the chamber on either side of the beam of charged particles, the first magnetic field sensor and the second magnetic field sensor being configured to be disposed symmetrically from one another with respect to an axis of propagation of the beam of charged particles, each magnetic field sensor comprising a conductive loop, each loop being formed in a plane passing through the axis of propagation of the beam of charged particles, a center of the conductive loop of the first magnetic field sensor being disposed symmetrically from a center of the conductive loop of the second magnetic field sensor, the conductive loop of the first magnetic field sensor and the conductive loop of the second magnetic field sensor being configured to have inductances different from one another.

2. The beam position monitor of claim 1, wherein the conductive loop of the first magnetic field sensor and the conductive loop of the second magnetic field sensor have numbers of turns different from one another, and/or shapes different from one another, and/or dimensions different from one another.

3. The beam position monitor of claim 1, wherein the conductive loop of the first magnetic field sensor and the conductive loop of the second magnetic field sensor each have a single turn, have shapes different from one another, and/or dimensions different from one another.

4. The beam position monitor of claim 1, wherein the conductive loop of the first magnetic field sensor and the conductive loop of the second magnetic field sensor have turns having the same shape and the same dimensions, respective numbers of the turns being different from one another.

5. The beam position monitor of claim 1, further comprising a third magnetic field sensor and a fourth magnetic field sensor configured to be installed in the chamber on either side of the beam of charged particles, each magnetic field sensor comprising a conductive loop, the conductive loop of the third magnetic field sensor and the conductive loop of the fourth magnetic field sensor being configured to have inductances different from one another.

6. The beam position monitor of claim 5, wherein the first magnetic field sensor, the second magnetic field sensor, the third magnetic field sensor, and the fourth magnetic field sensor are arranged in a same plane perpendicular to the beam of charged particles.

7. The beam position monitor of claim 1, further comprising a chassis configured to be fastened to the chamber and/or to form a section of the chamber, the chassis comprising:
    a central opening configured to let the beam of charged particles pass, and
    a receiving cavity for each magnetic field sensor, each receiving cavity opening into the central opening and being configured to receive one of the magnetic field sensors.

8. A particle accelerator comprising a chamber configured to guide a beam of charged particles, and the beam position monitor of claim 7.

9. A measurement system comprising the beam position monitor of claim 1 and a first adder, the first adder being configured to deliver a first difference signal representative of a difference in amplitude between a signal delivered by the first magnetic field sensor and another signal delivered by the second magnetic field sensor.

10. The measurement system of claim 9, further comprising a first integrator configured to receive the first difference signal and to deliver a first integrated signal corresponding to an integration over time of the first difference signal.

11. The measurement system of claim 9,
    the beam position monitor further comprising a third magnetic field sensor and a fourth magnetic field sensor configured to be installed in the chamber on either side of the beam of charged particles, each magnetic field sensor comprising a conductive loop, the conductive loop of the third magnetic field sensor and the conductive loop of the fourth magnetic field sensor being configured to have inductances different from one another; and
    the measurement system further comprising a second adder, the second adder being configured to deliver a second difference signal representative of a difference in amplitude between a signal delivered by the third magnetic field sensor and a signal delivered by the fourth magnetic field sensor.

12. The measurement system of claim 11, further comprising a second integrator configured to receive the second difference signal and to deliver a second integrated signal corresponding to an integration over time of the second difference signal.

13. The measurement system of claim 9, wherein the first adder is connected directly to the magnetic field sensors.

14. The measurement system of claim 11, wherein each of the first adder and the second adder is connected directly to the magnetic field sensors.

15. The measurement system of claim 10, further comprising a digitizer configured to receive the first integrated signal in analog form and to deliver a corresponding digitized integrated signal.

16. The measurement system of claim 12, further comprising a digitizer configured to receive the second integrated signal in analog form and to deliver a corresponding digitized integrated signal.

17. A particle accelerator comprising a chamber configured to guide a beam of charged particles, and the measurement system of claim 9.

* * * * *